(12) United States Patent
Mitchell et al.

(10) Patent No.: US 12,236,168 B2
(45) Date of Patent: Feb. 25, 2025

(54) MACHINE LEARNING FOR ANIMATRONIC DEVELOPMENT AND OPTIMIZATION

(71) Applicant: Disney Enterprises, Inc., Burbank, CA (US)

(72) Inventors: Kenneth J. Mitchell, Glendale, CA (US); Matthew W. Mccrory, Chicago, IL (US); Jeremy Oliveira Stolarz, La Crescenta, CA (US); Joel D. Castellon, Berlin (DE); Moritz N. Bächer, Zurich (CH); Alfredo M. Ayala, Jr., West Covina, CA (US)

(73) Assignee: Disney Enterprises, Inc., Burbank, CA (US)

( * ) Notice: Subject to any disclaimer, the term of this patent is extended or adjusted under 35 U.S.C. 154(b) by 906 days.

(21) Appl. No.: 16/601,919

(22) Filed: Oct. 15, 2019

(65) Prior Publication Data

US 2021/0110001 A1   Apr. 15, 2021

(51) Int. Cl.
| | |
|---|---|
| *G06F 30/17* | (2020.01) |
| *G06F 30/20* | (2020.01) |
| *G06N 3/08* | (2023.01) |
| *G06N 20/00* | (2019.01) |
| *G06T 13/40* | (2011.01) |
| *G06T 17/20* | (2006.01) |

(52) U.S. Cl.
CPC .............. *G06F 30/17* (2020.01); *G06F 30/20* (2020.01); *G06N 3/08* (2013.01); *G06N 20/00* (2019.01); *G06T 13/40* (2013.01); *G06T 17/20* (2013.01)

(58) Field of Classification Search
CPC ......... G06F 30/17; G06F 30/20; G06N 20/00; G06N 3/08; G06T 13/40; G06T 17/20
USPC ............................................................ 703/1
See application file for complete search history.

(56) References Cited

U.S. PATENT DOCUMENTS

| | | | |
|---|---|---|---|
| 8,847,963 B1* | 9/2014 | Comet | G06T 19/20 345/473 |
| 2019/0122409 A1* | 4/2019 | Meadows | G06N 3/08 |

OTHER PUBLICATIONS

Hyung_2019 (Optimizing Android Facial Expressions Using Genetic Algorithms, Applied Sciences, Aug. 16, 2019). (Year: 2019).*
Edwards_2004 (Modeling and Feedback Control of a MEMS Electrostatic Actuator, May 2004). (Year: 2004).*
NeuroAnimator_1998 (NeuroAnimator: Fast Neural Network Emulation and Control of Physics-Based Models, SIGGRAPH 98, Orlando, FL, Jul. 19-24, 1998) (Year: 1998).*

(Continued)

*Primary Examiner* — Brian S Cook
(74) *Attorney, Agent, or Firm* — Squire Patton Boggs LLP; Sarah Mirza

(57) ABSTRACT

Techniques for animatronic design are provided. A plurality of simulated meshes is generated using a physics simulation model, where the plurality of simulated meshes corresponds to a plurality of actuator configurations for an animatronic mechanical design. A machine learning model is trained based on the plurality of simulated meshes and the plurality of actuator configurations. A plurality of predicted meshes is generated for the animatronic mechanical design, using the machine learning model, based on a second plurality of actuator configurations. Virtual animation of the animatronic mechanical design is facilitated based on the plurality of predicted meshes.

20 Claims, 9 Drawing Sheets

(56) References Cited

OTHER PUBLICATIONS

Teran_2005 (Robut Quasistatic Finite Element and Flesh Simulation, Eurographics/ACM SIGGRAPH symposium on Computer Animation (2005)). (Year: 2005).*
Eckart_hse4_2005 (Rotary-linear actuator HSE4, 2005) (Year: 2005).*
MRQ*32/40 Rotary Actuator SMC Manufacturing Pneumatics WorldWide, May 12, 2017 (Year: 2017).*
Goodfellow et al., "Generative Adversarial Nets," University of Montreal, 9 pages (Accessed Online: <https://papers.nips.cc/paper/5423-generative-adversarial-nets>).
Yoram Baram, Ran El-Yaniv, and Kobi Luz. 2004. Online Choice of Active Learning Algorithms. J. Mach. Learn. Res. 5 (Dec. 2004), 255-291.
Wei-Ning Hsu and Hsuan-Tien Lin. 2015. Active Learning by Learning. In AAAI, Blai Bonet and Sven Koenig (Eds.). AAAI Press, 2659-2665.
S. Raphael K. Konyushkova and P. Fua. 2017. Learning Active Learning from Data. In Conference on Neural Information Processing Systems. (Accessed Online: <https://papers.nips.cc/paper/7010-learning-active-learning-from-data.pdf>).
Manfred K. Warmuth, Jun Liao, Gunnar Rä?tsch, Michael Mathieson, Santosh Putta, and Christian Lemmen, "Active Learning with Support Vector Machines in the Drug Discovery Process," J. Chem. Inf. Comput. Sci. 2003, 43, 667-673.
Andreas Krause, Ajit Singh, and Carlos Guestrin. 2008. Near-Optimal Sensor Placements in Gaussian Processes: Theory, Efficient Algorithms and Empirical Studies. Journal of Machine Learning Research (JMLR) 9 (Feb. 2008), 235-284.
Dan Pelleg and Andrew W. Moore. 2005. Active Learning for Anomaly and Rare-Category Detection. In Advances in Neural Information Processing Systems 17, L. K. Saul, Y. Weiss, and L. Bottou (Eds.). MIT Press, 1073-1080.
Ozan Sener and Silvio Savarese. 2018. Active Learning for Convolutional Neural Networks: A Core-Set Approach. In International Conference on Learning Representations. <https://openreview.net/forum?id=H1aluk-RW>.
Burr Settles. 2009. Active Learning Literature Survey. Computer Sciences Technical Report 1648. University of Wisconsin-Madison., 48 pages.
S. Sivaraman and M.M Trivedi. 2014. Active learning for on-road vehicle detection: a comparative study. (2014). <https://doi.org/10.1007/s00138-011-0388-y> (Abstract Only).
Simon Tong and Daphne Koller. 2002. Support Vector Machine Active Learning with Applications to Text Classification. J. Mach. Learn. Res. 2 (Mar. 2002), 45-66.
Cheng et al., "Polynomial Regression as an Alternative to Neural Nets," arXiv:1806.06850v3 [cs.LG] Apr. 10, 2019.
Ichim, et al., "Phace: Physics-based Face Modeling and Animation," ACM Transactions on Graphics, vol. 36, No. 4, Article 153. Publication date: Jul. 2017.
Weise et al., "Realtime Performance-Based Facial Animation," [Accessed Online: <https://lgg.epfl.ch/publications/2011/RPBFA/paper.pdf> ].
Bailey et al.,"Fast and Deep Deformatoin Approximations," ACM Trans. Graph., vol. 37, No. 4, Article 119. Publication date: Aug. 2018.

\* cited by examiner

MACHINE LEARNING FOR ANIMATRONIC DEVELOPMENT AND OPTIMIZATION

BACKGROUND

The present disclosure generally relates to machine learning, and more specifically, to aiding animatronic design using machine learning.

Developing an animatronic is an expensive and time-consuming process. Typically, existing techniques require construction of electronic and mechanical machinery (e.g., actuators and a mechanical assembly, such as a rigid frame or skeleton), along with construction and attachment of an artificial skin to complete the animatronic. Further, animation software must be prepared to drive the motion of the animatronic. This takes significant time and effort, and it is only after all of these efforts are completed that designers can view how the animatronic looks in motion and in various poses. Redesign or modification of the animatronic at this stage is difficult and expensive, often requiring restarting the entire process. Existing attempts to facilitate the development process using computer-aided design are typically either inadequately accurate or excessively compute-intensive, rendering them unsuitable for practical use.

SUMMARY

According to one embodiment of the present disclosure, a method is provided. The method includes generating a first plurality of simulated meshes using a physics simulation model, wherein the first plurality of simulated meshes corresponds to a first plurality of actuator configurations for an animatronic mechanical design. The method further includes training a machine learning model based on the first plurality of simulated meshes and the first plurality of actuator configurations. Additionally, the method includes generating, using the machine learning model, a plurality of predicted meshes for the animatronic mechanical design, based on a second plurality of actuator configurations. Further, the method includes facilitating virtual animation of the animatronic mechanical design based on the plurality of predicted meshes.

According to a second embodiment of the present disclosure, a non-transitory computer-readable medium is provided. The non-transitory computer-readable medium contains computer program code that, when executed by operation of one or more computer processors, performs an operation. The operation includes generating a first plurality of simulated meshes using a physics simulation model, wherein the first plurality of simulated meshes corresponds to a first plurality of actuator configurations for an animatronic mechanical design. The operation further includes training a machine learning model based on the first plurality of simulated meshes and the first plurality of actuator configurations. Additionally, the operation includes generating, using the machine learning model, a plurality of predicted meshes for the animatronic mechanical design, based on a second plurality of actuator configurations. Further, the operation includes facilitating virtual animation of the animatronic mechanical design based on the plurality of predicted meshes.

According to a third embodiment of the present disclosure, a system is provided. The system includes one or more computer processors, and a memory containing a program which when executed by the one or more computer processors performs an operation. The operation includes generating a first plurality of simulated meshes using a physics simulation model, wherein the first plurality of simulated meshes corresponds to a first plurality of actuator configurations for an animatronic mechanical design. The operation further includes training a machine learning model based on the first plurality of simulated meshes and the first plurality of actuator configurations. Additionally, the operation includes generating, using the machine learning model, a plurality of predicted meshes for the animatronic mechanical design, based on a second plurality of actuator configurations. Further, the operation includes facilitating virtual animation of the animatronic mechanical design based on the plurality of predicted meshes.

BRIEF DESCRIPTION OF THE DRAWINGS

So that the manner in which the above recited aspects are attained and can be understood in detail, a more particular description of embodiments described herein, briefly summarized above, may be had by reference to the appended drawings.

It is to be noted, however, that the appended drawings illustrate typical embodiments and are therefore not to be considered limiting; other equally effective embodiments are contemplated.

DETAILED DESCRIPTION

Figure 1:
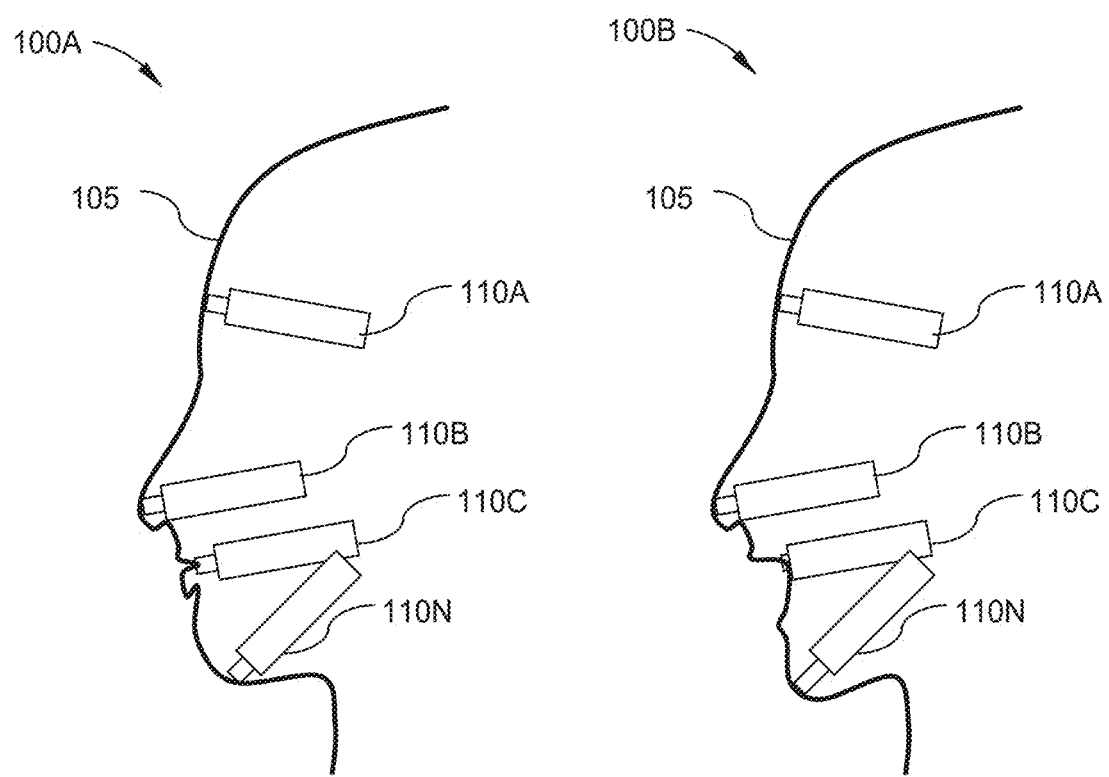
FIG. 1 illustrates an animatronic face, according to one embodiment of the present disclosure.

In order to develop mechanical animatronic designs, experienced developers construct a mechanical assembly, determine the size(s), shape(s), and location(s) of actuation points where the actuators connect to or contact with the artificial skin, and further design the artificial skin itself (e.g., the surface shape, as well as the thickness and elasticity in various areas of the skin). This intensive process is time-consuming and expensive. Further, in traditional workflows, the designer cannot truly observe and validate the design until it is actually built, because it is difficult or impossible to predict how the skin will stretch, compress, and fold as the actuators move. Embodiments of present disclosure provide techniques to use machine learning in order to predict how an animatronic mechanical design will look and respond once fully constructed.

In some embodiments, a physics simulation model is used to simulate the animatronic mechanical design. In an embodiment, the simulation model receives a digital representation of the mechanical design, including the location, type, and orientation of each actuator, the attributes of the artificial skin, the actuation points, and any other attributes needed to simulate the design. In use, the physics model receives actuator configurations specifying the state of each actuator, and generates a digital mesh that simulates the expected shape of the artificial skin. In one embodiment, the actuator configurations specify one or more values for each actuator. In embodiments, this can include rotational coordinates and/or translational coordinates. In some embodiments, the actuator configurations are given as a set of six values for each actuator (e.g., an X, Y, and Z translational coordinate, as well as rotational coordinates in each dimension). In an embodiment, the simulated mesh is generated as a volumetric mesh consisting of finite elements, whose outer boundary faces (e.g., elements without a neighbor) constitute the outer surface of the simulated skin.

Although accurate, this simulation model is also extremely compute-intensive, reducing the practicality of using the model in real-time. That is, the physics simulation consumes significant computing resources and time to generate a single simulated mesh, which makes it difficult and expensive to view the animatronic design in motion (which requires generation of many simulated meshes at a large number of actuator configurations). In one embodiment, a set of simulated meshes are generated using the physics simulation model, and these meshes are used to train one or more machine learning model(s). These learned models can then be used to generate predicted meshes more rapidly, which allows users to validate and refine animatronic designs in a quicker and more cost-effective manner.

In one embodiment, a learned computational approach is used to provide interactive design of high fidelity animatronic facial performances. To construct the animatronic, a quasi-static simulation framework is used to solve for the state of the mechanical assembly and the state of the attached artificial (e.g., silicone) skin, given a configuration of rotational and/or linear actuators. In some embodiments, to enable interactive pose design, a shallow fully-connected neural network is trained using input motor activations to solve the simulated mesh vertices directly. Most traditional machine learning focuses on classification problems, and typical heuristics used require probability estimates over a discrete set of classes. These existing systems are inadequate for generating predicted meshes, as placing mesh vertices in three-dimensional space is a complex problem that goes far beyond simple classification. Embodiments of the present disclosure provide techniques to train machine learning models for this task.

To deform artificial skin into a given pose, the skin is attached at actuation points to a mechanism driven by a set of motors/actuators. In some embodiments of the present disclosure, the animatronic is a facial construction, which requires high accuracy in order to immerse viewers. Embodiments of the present disclosure provide machine learning models that accurately predict skin deformations based on a given configuration of the actuators. In one embodiment, the input for the learned models includes a configuration of each actuator. In embodiments, each actuator configuration is a state vector of one or more values for each degree of freedom the actuator has. For example, a linear actuator or a simple rotational actuator may each have one degree of freedom (in and out, or a degree of rotation, respectively). In some embodiments, each actuator configuration consists of rotational and/or translational components. That is, in one embodiment, a six-dimensional vector is used to represent the rotational and translational configuration of each actuator (e.g., an X, Y, and Z rotation or orientation, as well as an X, Y, and Z translation).

In one embodiment, to formulate mechanical joint constraints that restrict the relative motion between pairs of components, frames are defined that remain constant in local component coordinates. That is, coordinate frames are introduced that move with the assembly components. Global coordinates can then be transformed by applying rigid transformations encoded in the state vector, formulating a set of constraints between centers and pairs of axes. For example, for a hinge connecting two components, the two frame centers coincide in global coordinates, and the transformed z-axis of the frame on the first component remains orthogonal to the transformed y and z axes of the frame on the second component (assuming the hinge axis is along the z axis).

FIG. 1 illustrates an animatronic face, according to one embodiment of the present disclosure. In the illustrated embodiment, the facial profile comprises an Artificial Skin 105, controlled by a set of Actuators 110A-N. Although linear actuators are illustrated, in embodiments, any collection of actuators can be used, including rotational, linear, and combinational actuators. Additionally, in embodiments, motors or Actuators 110A-N may be utilized to drive a mechanical assembly that in turn, actuates the Artificial Skin 105. As illustrated by the Configuration 100A, when the Actuators 110A-N have a first configuration, the Artificial Skin 105 has a neutral expression with the mouth held closed. As further illustrated in FIG. 1, when the Actuators 110A-N take a different Configuration 100B, the Artificial Skin 105 deforms to open the mouth and form a different expression.

In embodiments, any number and type of Actuator 110 may be utilized to attach to the Artificial Skin 105 at defined actuation points, which are selected by a designer. In some embodiments, the selection of Actuator 110 type, power, and placement is aided by a design system that is used to predict the power and placement needed to achieve a given deformation, and to predict the resulting deformation from a given configuration of Actuators 110. In some embodiments, the artificial skin is a silicone (or other similarly elastic) material that is rigidly attached to the animatronic design in some places, and attached to movable actuators in others. In one embodiment, the thickness and/or elasticity of the Artificial Skin 105 is controlled to provide predictable and preferred deformations. Although an animatronic face is illustrated, embodiments of the present disclosure can be utilized to simulate the elastic deformations of any animatronic mechanical design.

Figure 2:
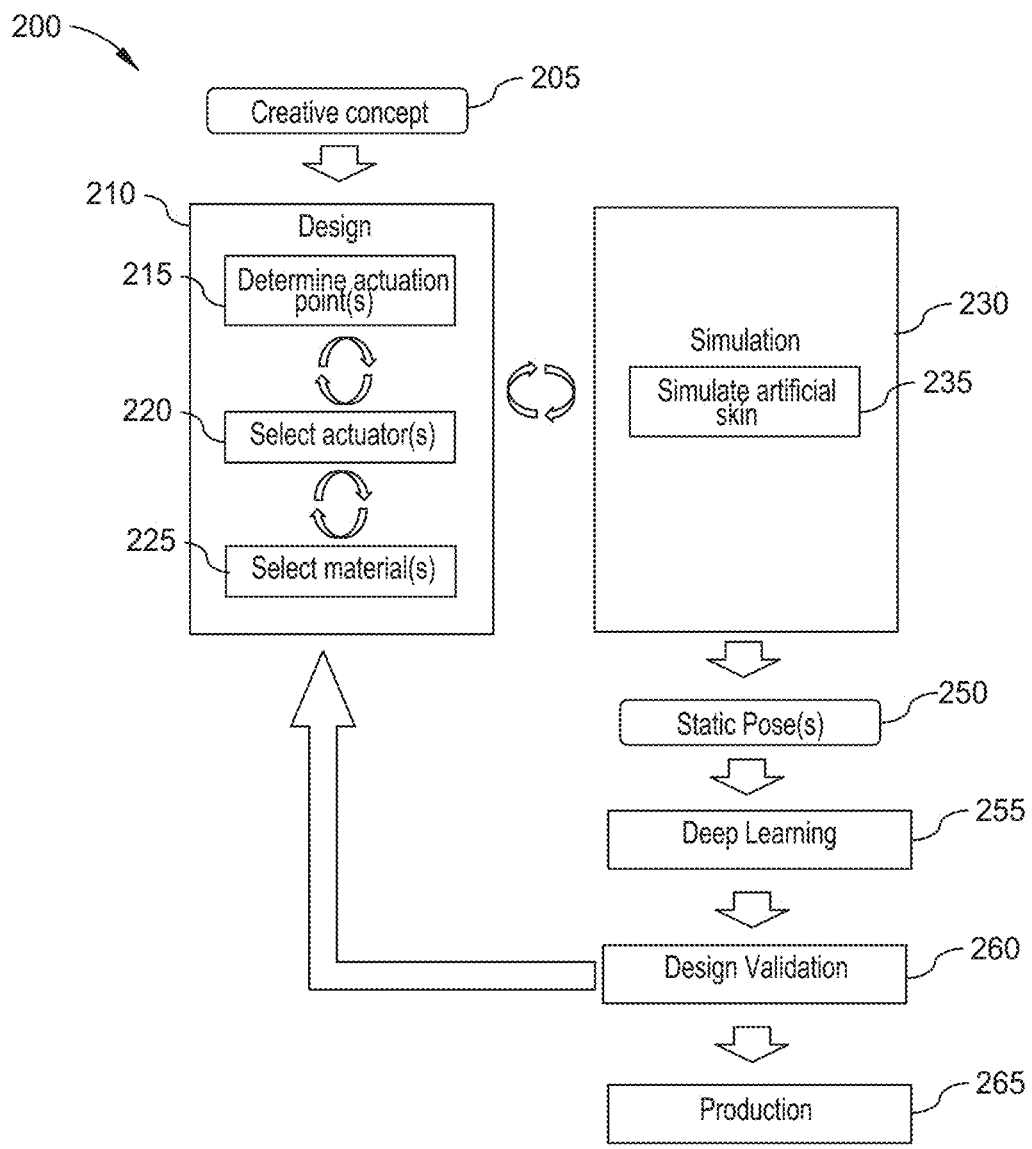
FIG. 2 depicts a workflow for using deep learning to facilitate animatronic development, according to one embodiment disclosed herein.

FIG. 2 depicts a Workflow 200 for using deep learning to facilitate animatronic development, according to one embodiment disclosed herein. In the illustrated Workflow 200, the process begins with a Creative Concept 205. That is, a designer or developer conceives of an animatronic design (e.g., a character) that they wish to create. The Workflow 200 then enters a stage for Design 210, where the physical animatronic design is developed and refined. As illustrated, the Design 210 includes, among other things, determining actuation points on the artificial skin (block 215), selecting actuator types and locations to utilize (block 220), and selecting the material(s) to be used for the artificial skin and/or skeleton (block 225). In some embodiments, the Design 210 is performed with the assistance of computer-aided design (CAD) software. As illustrated, each of these selections are interrelated, and decisions made with respect to one aspect of the design can affect the decisions made with respect to others.

As illustrated, once an initial design is developed, the Workflow 200 moves to a phase for Simulation 230. In an embodiment, the Simulation 230 generally includes using one or more physics simulation models to simulate artificial skin deformations based on the animatronic mechanical design, and to refine the design based on these simulations. As illustrated, the Simulation 230 includes simulating the artificial skin deformations (block 235).

In the illustrated embodiment, the Simulation 230 and Design 210 often occur as an iterative and back-and-forth process, until the designer is satisfied with the animatronic mechanical design. As discussed above, in one embodiment, the Simulation 230 enables the generation of a set of simulated meshes representing the artificial skin under various actuator configuration states. However, the Simulation 230 is quite compute-intensive, and requires significant time and expense. In some embodiments, the Simulation 230 is thus impractical for real-time interactive manipulation of the mesh.

In the illustrated Workflow 200, the physics simulation model is used to generate a data set of Static Pose(s) 250. In one embodiment, each Static Pose 250 is simulated based on a corresponding set of actuator configurations for the actuator(s) that make up the animatronic design. In one embodiment, the Static Pose(s) 250 include one or more poses representing the endpoints of each actuator. That is, in an embodiment, a number of Static Poses 250 are generated using independent maximum and minimum actuator configurations representing the extremes of each actuator. For example, if an actuator can rotate between zero and one-hundred degrees, in one embodiment, the Static Poses 250 include at least one pose with the actuator at zero degrees, and at least one pose with the actuator at one-hundred degrees.

In some embodiments, a set of random Static Poses 250 are generated as intermediate poses between these extremes. In an embodiment, this includes using a random or pseudo-random algorithm to generate actuator configurations for each actuator, and generating a simulated mesh using the generated configurations. For example, if the animatronic design includes ten actuators, each with six degrees of freedom, the system may generate a value for each degree of freedom, for each actuator, and uses these values to generate a Static Pose 250. The process can then be repeated until a sufficient number of Static Poses 250 have been generated to train the learning models.

As illustrated, once the Static Poses 250 have been simulated, the Workflow 200 progresses to Deep Learning 255, where the Static Poses 250 are used to train one or more machine learning models. In one embodiment, three machine learning models are used to predict each channel (e.g., X, Y, and Z) independently. That is, in an embodiment, a first machine learning model is used to predict an "X" value for each vertex in the predicted mesh, a second model predicts the "Y" value for each vertex, and a third model predicts the "Z" value for each vertex. The output of these models can then be combined to create a predicted mesh, where each vertex in the mesh has a position in three-dimensional space given by the coordinates (x, y, z). In some embodiments, Deep Learning 255 includes one or more neural networks. In other embodiments, the Deep Learning 255 may include use of polynomial regression, or other purely analytical approaches.

In one embodiment, training the Deep Learning 255 comprises providing a set of actuator configurations as input to the model(s), and applying the corresponding simulated mesh as the target output. In an embodiment, the models are configured to optimize surface-to-surface loss such that the generated predicted mesh closely aligns with the simulated mesh. In one embodiment, optimizing surface-to-surface loss includes optimizing vertex-to-vertex loss. In some embodiments, each model has a number of input neurons equal to the number of actuators in the animatronic design, such that the configuration of a given actuator serves as input for a corresponding neuron in the input layer. In one embodiment, each input neuron can correspond to either (i) a single actuator, (ii) a combination of actuators (e.g., a combinatorial function of two or more actuators, such as a linear combination), or (iii) an actuation point on the artificial skin (which may be controlled by one or more actuators). Further, in one embodiment, the output layer includes a neuron to correspond to each vertex in the predicted mesh. That is, in such an embodiment, each neuron in the output layer of the model generates a coordinate value (e.g., a location along the X, Y, or Z axis) for a given vertex.

In some embodiments, the Deep Learning 255 uses a fully-connected generator model. In an embodiment, this is a shallow model using just three fully connected layers: an input layer, a single hyperbolic-tangent activated hidden layer, and a linear-activated output layer. In some embodiments, the input values are normalized to a range from zero to one before being input. For example, the input for an actuator that ranges from forty-five to one-hundred degrees can be normalized to between zero and one, as can the input for an actuator that ranges from zero to two-hundred degrees. In embodiments, the size of the hidden layer is dependent in part on the particular dataset being used. In one embodiment, the hidden layer includes between one and two times the number of input neurons (e.g., between one and two times the number of actuators). Experimentation has shown that, for an animatronic human face with thirteen actuators, a hidden layer with thirteen neurons performs well. For a fantasy character design that included eleven actuators, twenty-two neurons in the hidden layer yielded the best results.

In some embodiments, a Generative Adversarial Network (GAN) is used for the Deep Learning 255. In such an embodiment, two separate neural networks (or sets of neural networks) are trained: a first network (or trio of networks) acts as a generator to generate predicted meshes, and a second network (or trio of networks) acts as a discriminator to attempt to differentiate between the generated meshes and the underlying ground truth (the simulated mesh). In one embodiment, the generator phase utilizes a similar architecture to the fully-connected generator model discussed above, while the discriminator utilizes five convolution layers that process polygons hierarchically. In such an embodiment, the first layer of the discriminator passes a filter through the x, y, and z coordinates of each triangle in the mesh, and subsequent layers pass filters through groups of these polygons.

In one embodiment, the fully-connected generator model can be trained more rapidly and simply, allowing it to produce relatively higher fidelity results after fewer training iterations, as compared to the GAN approach. The GAN model, in contrast, can take richer vertex information into account (e.g., mesh topology), which may allow it to provide more robust predictions, especially for poses that are not common in the training set. Embodiments of the present disclosure can utilize either (or both) models, depending on the particular implementation.

After training the Deep Learning 255, the trained model(s) can be used to generate predicted meshes for the animatronic design, given a pose (e.g., a set of actuator configurations). Using these models, therefore, designers can provide actuator configurations (or a series of actuator configurations) to generate the corresponding predicted mesh(es). As depicted in the illustrated workflow 200, this enables Design validation 260. In one embodiment, a user provides a sequence of configurations, and the models output a series of meshes, which can be combined to create a predicted mesh that moves over time, representing the animatronic design in motion (e.g., as the actuators move). In some embodiments, this is output as a video or animation file.

In one embodiment, the user(s) perform Design Validation 260 based on whether the predicted mesh(es) align with their goals and intentions for the animatronic design (e.g., whether the predicted facial deformations fit with their vision for the character). In some embodiments, some or all of the Design Validation 260 is performed automatically. For example, artistic input (e.g., a target animation) could be compared to the predicted meshes, in order to validate the design. In one embodiment, the system applies predefined criteria to checks each predictive mesh for potential concerns. For example, in an embodiment, if the distance between two or more predicted vertices is less than a predefined threshold, the system may note that the artificial skin is likely to be too-densely squeezed, resulting in deterioration of the skin, and/or undesired deformations. Similarly, if the distance between two or more vertices exceeds a threshold, the system may determine that the skin will be stretched too tightly/too thinly, potentially leading to similar deterioration or undesired deformation.

As illustrated, if the design is successfully validated, the workflow 200 proceeds to block 265, where production occurs, and the animatronic mechanical design can be physical constructed. In an embodiment, this includes sending the design parameters to one or more other systems or users to assemble the actuator frame, create the artificial skin, and the like. In contrast, if the user is not satisfied with the predictive motions and deformations (or if the automated system identifies potential concerns), the workflow 200 returns to the Design 210 stage. This iterative process can be repeated until the predicted deformations are satisfactory.

Figure 3:
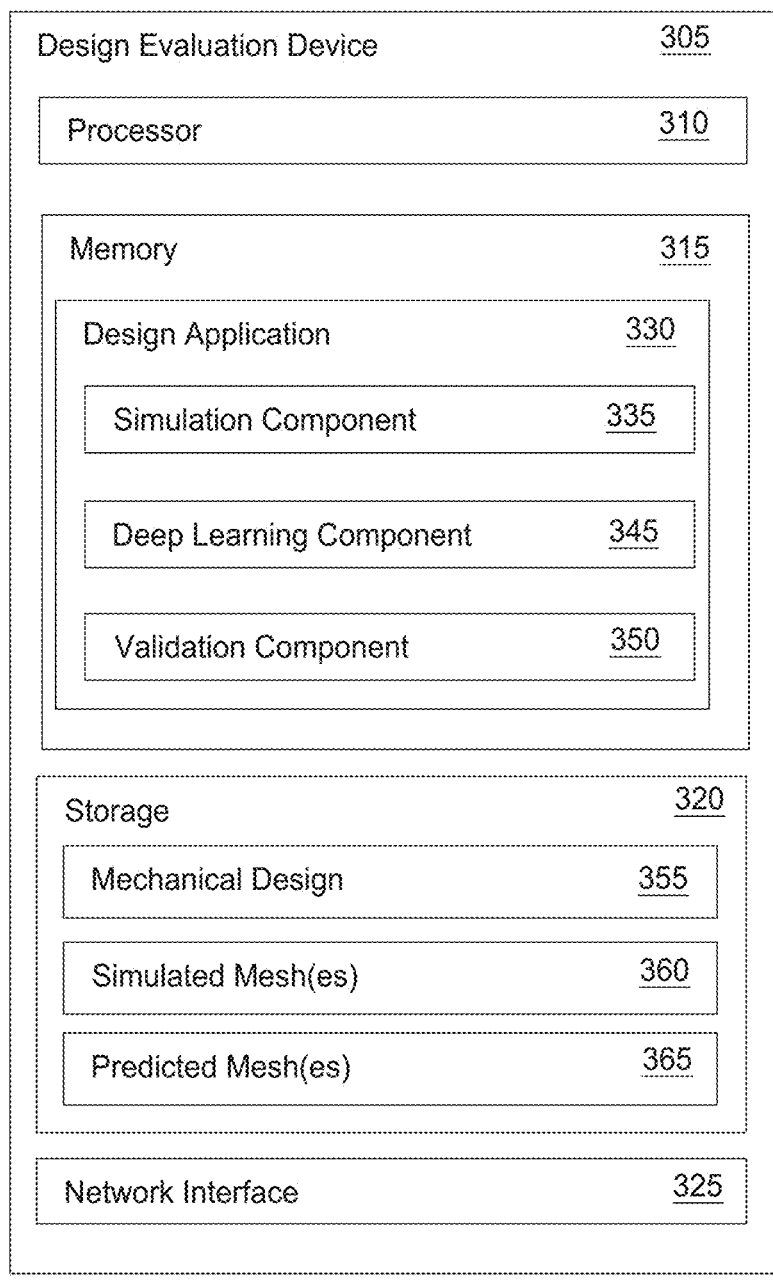
FIG. 3 is a block diagram illustrating a design evaluation device, according to one embodiment disclosed herein.

FIG. 3 is a block diagram illustrating a Design Evaluation Device 305, according to one embodiment disclosed herein. Although illustrated as a discrete computing device, in embodiments, the operations of the Design Evaluation Device 305 may be implemented as a virtual machine, as software (e.g., executing in a cloud environment), and the like. As illustrated, the Design Evaluation Device 305 includes a Processor 310, a Memory 315, Storage 320, and a Network Interface 325. In the illustrated embodiment, Processor 310 retrieves and executes programming instructions stored in Memory 315 as well as stores and retrieves application data residing in Storage 320. Processor 310 is representative of a single CPU, multiple CPUs, a single CPU having multiple processing cores, and the like. In some embodiments, the Processor 310 includes one or more graphics processing units (GPUs). Memory 315 is generally included to be representative of a random access memory. Storage 320 may be a disk drive or flash-based storage device, and may include fixed and/or removable storage devices, such as fixed disk drives, removable memory cards, or optical storage, network attached storage (NAS), or storage area network (SAN). Via the Network Interface 325, the Design Evaluation Device 305 can be communicatively coupled with one or more other devices and storage repositories.

In the illustrated embodiment, the Storage 320 includes one or more Mechanical Designs 355, one or more Simulated Meshes 360, and one or more Predicted Meshes 365. In an embodiment, each Mechanical Design 355 specifies parameters and arrangements that represent an animatronic design. For example, in such an embodiment, the Mechanical Design 355 indicates the number, type, power, location, orientation, and any other relevant parameters for each actuator and/or actuation point in the design. In an embodiment, the Mechanical Design 355 indicates both the configuration of actuators, as well as the location, size, orientation, and the like of each actuation point they drive. In some embodiments, the Mechanical Design 355 further specifies the details of the underlying mechanical assembly (e.g., its shape and material, where the skin and/or actuators attach, and the like). Further, in one embodiment, the Mechanical Design 355 defines the artificial skin (e.g., the material, density, thickness, actuation/connection points, a mesh representing the surface(s) of the skin, and the like). In an embodiment, the Mechanical Design 355 generally includes the details necessary to simulate and/or construct the animatronic.

In the illustrated embodiment, the Simulated Meshes 360 are three-dimensional surface meshes made of elements (e.g., tetrahedral elements). In one embodiment, during simulation, the simulator derives the deformed nodes of these elements and generates volumetric meshes, in order to output surface meshes of the deformed skin (e.g., to output Simulated Meshes 360). In one embodiment, the Simulated Meshes 360 are generated by using a physics simulation model that uses physics to simulate the deformations that will occur in an artificial skin given a set of configurations for actuators that are coupled to the skin. In embodiments, this simulation process is highly accurate, but is compute-intensive and time-consuming. In some embodiments, the actuator configurations used to create the Simulated Meshes 360 are selected in a way that ensures adequate coverage of all potential poses the animatronic can make (or that the designer expects to use).

In embodiments, these Simulated Meshes 360 are used to train one or more deep learning models (e.g., convolutional neural networks). For example, for each of the Simulated Meshes 360, the corresponding actuator parameters can be applied as input to the learning model(s), while the Simulated Mesh 360 (e.g., the x, y, and z coordinate of each surface vertex) is used as the target output. In this way, the models can be trained and refined to predict mesh deformations given sets of actuator parameters. In the illustrated embodiment, the Predicted Meshes 365 are three-dimensional surface meshes of the skin, each comprising a set of vertices connected by one or more edges and/or polygons. In some embodiments, rather than being trained to generate surface meshes, the simulation is trained on volumetric meshes (e.g., generated by the simulation components) and similarly generates volumetric meshes. In an embodiment, the Predicted Meshes 365 are generated by providing actuator configurations to the trained learning model(s). Although depicted as residing in Storage 320, in embodiments, the Mechanical Design(s) 355, Simulated Mesh(es) 360, and Predicted Mesh(es) 365 may reside in any suitable location.

As illustrated, the Memory 315 includes a Design Application 330 which is used to evaluate and validate animatronic designs. Although depicted as software residing in Memory 315, in embodiments, the operations of the Design Application 330 can be implemented using hardware, software, or a combination of hardware and software. In the illustrated embodiment, the Design Application 330 includes a Simulation Component 335, a Deep Learning Component 345, and a Validation Component 350. Although depicted as discrete components for conceptual clarity, in embodiments, the functionality and operations of the Simulation Component 335, Deep Learning Component 345, and Validation Component 350 may be combined or distributed across any number of components.

In an embodiment, the Simulation Component 335 receives a Mechanical Design 355 and uses a physics simulation to generate a corresponding Simulated Mesh 360 for one or more sets of actuator configurations. In some embodiments, the Simulation Component 335 receives an indication of the desired configurations. In another embodiment, the Simulation Component 335 generates one or more sets of actuator values to be used to generate the Simulated Meshes 360. In embodiments, the actuator configurations are selected to provide a diverse set of poses to train the deep learning model(s). In some embodiments, values are chosen to cover the extremes of each actuator, as well as a random sample of values between these extremes.

In one embodiment, generating the Simulated Meshes 360 involves iteratively proceeding through stages of generation for each set of actuator values, until a full mesh is generated. In some embodiments, one or more of these stages are potentially re-usable between poses. For example, in such an embodiment, the first stage for a first set of configuration parameters may generate intermediate results that apply to a second set of configuration values as well. In such an embodiment, the Simulation Component 335 can preserve these intermediate stages in order to enable more efficient and faster generation of the Simulated Meshes 360. For example, in one embodiment, the Simulation Component 335 can periodically check whether the output of a previously stage can be re-used for the current generation stage. If so, this output is applied, rather than re-computing the simulation stage.

In the illustrated embodiment, the Deep Learning Component 345 receives the Simulated Meshes 360 and trains one or more machine learning models using them. In an embodiment, the Deep Learning Component 345 generates and trains a fully-connected generator convolutional neural network to generate the Predicted Meshes 365. In one embodiment, the neural network uses an input layer equal in size to the number of actuators in the Mechanical Design 355. For example, if the animatronic design utilizes thirty actuators, in one embodiment, the Deep Learning Component 345 utilizes thirty neurons in the input layer of the network. Further, in one embodiment, the neural network utilizes an output layer equal in size to the number of vertices to be included in the Predicted Meshes 365. For example, if the output meshes include five hundred vertices, the output layer of the generator network will similarly include five hundred vertices.

In some embodiments, the Deep Learning Component 345 generates each channel (e.g., the x, y, and z coordinates) independently. In such an embodiment, the Deep Learning Component 345 can train three neural networks: a first that generates a value for the "x" coordinate of each vertex, a second that generates a value for the "y" coordinate of each vertex, and a third that generates a value for the "z" coordinate of each vertex. In this way, the position in three-dimensional space of each vertex in the Predicted Mesh 365 is determined by the output from a corresponding neuron in each of the trained networks. In embodiments, the number of hidden layers, as well as the number of neurons included in each hidden layer, can be tweaked based on the Mechanical Design 355 and Simulated Meshes 360. In one embodiment, a single hidden layer with a size between one and two times the number of actuators yields accurate results.

In an embodiment, to train the generator network, the Deep Learning Component 345 iteratively refines the neural network based on each Simulated Mesh 360. To do so, the Deep Learning Component 345 applies the mesh as target output for the model. That is, the Deep Learning Component 345 applies the x, y, and/or z coordinate of each respective vertex in the Simulated Mesh 360 as the target output for the corresponding neuron in the output layer of the machine learning model. The actuator configuration that was used to generate this Simulated mesh 360 is similarly applied as input to the model. In an embodiment, the Deep Learning Component 345 then modifies one or more weights in the network, based on a loss formula that optimizes vertex-to-vertex (or surface-to-surface) loss. That is, the Deep Learning Component 345 can determine a distance between each predicted vertex and the corresponding simulated vertex. This distance can then be back-propagated through the network to refine the model.

In some embodiments, in addition to a generator network, the Deep Learning Component 345 also utilizes a discriminator network to form a GAN model. In such an embodiment, the discriminator is trained to attempt to classify input meshes as either a Simulated Mesh 360 (e.g., one that was generated using the physics simulation model) or a Predicted Mesh 365 (e.g., one that was generated using the deep learning model(s)). If the discriminator cannot tell the difference (e.g., it cannot reliably classify input meshes), the Deep Learning Component 345 determines that the generator model is sufficiently trained, and is ready for use in design validation.

In the illustrated embodiment, the Validation Component 350 is used to validate the models and/or the Mechanical Design 355. In one embodiment, the Validation Component 350 provides a graphical user interface (GUI) that enables users can specify one or more actuator configurations, and view the corresponding Predicted Mesh(es) 365. In one embodiment, the user can specify a start pose and an end pose (e.g., six-dimension vectors corresponding to a start and end pose for the animatronic design), and the Validation Component 350 generates a set of intermediate actuator configurations. The Validation Component 350 can then generate a set of Predicted Meshes 365 using these configurations, in order to depict the animatronic design in motion. In one embodiment, the Validation Component 350 provides the three-dimensional mesh itself, allowing users to navigate around it and view it from different angles. In another embodiment, the Validation Component 350 can render one or more images from one or more perspectives around the mesh, in order to provide a video file depicting the deformation of the artificial skin as the animatronic moves.

In an embodiment, the Deep Learning Component 345 and/or Validation Component 350 are used to improve the research and development process for animatronic constructions (e.g., to expedite the process of designing and constructing the animatronic). In some embodiments, the Deep Learning Component 345 and/or Validation Component 350 are further used to provide animators with a realistic and accurate rig to animate with using digital artist tools. This in turn allows animators to animate using these offline tools in a manner that is very similar to animating on the actual animatronic itself. For example, users may use buttons, sliders, and the like to move actuators in the rig, while the Deep Learning Component 345 generates predicted meshes for the input values. This allows users to view and animate the planned animatronic in a highly-realistic environment. In some embodiments, the user can further use these input values as the actuator values that are used to animate the physical animatronic.

Figure 4:
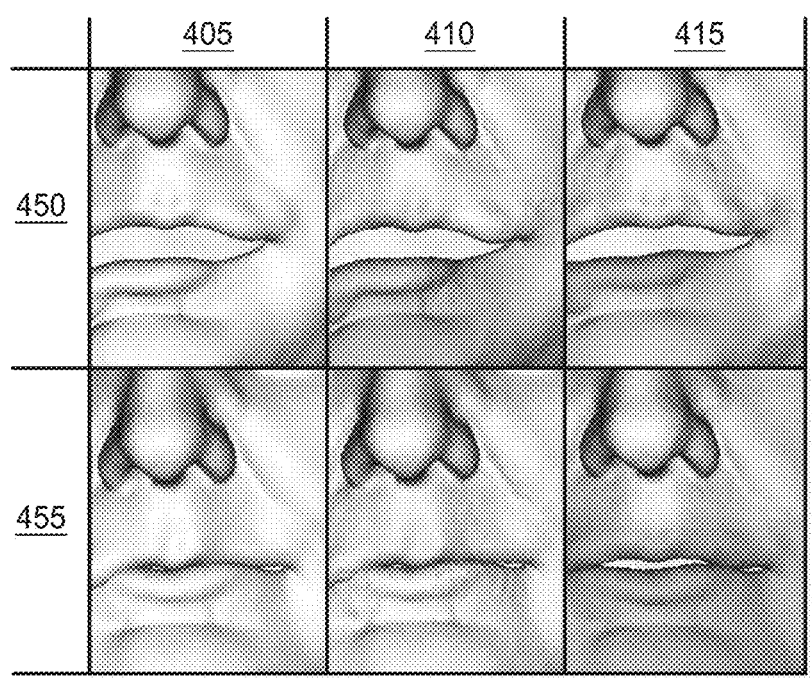
FIG. 4 depicts a set of predicted meshes generated using machine learning, according to one embodiment disclosed herein.

FIG. 4 depicts a set of Predicted Meshes 365 generated using machine learning, according to one embodiment disclosed herein. In the illustrated embodiment, each mesh included in the Column 405 corresponds to a "ground truth" Simulated Mesh 360. That is, the meshes included in the Column 405 were generated using by the Simulation Component 335 using a physic simulation model. Further, the meshes depicted in Column 410 were generated using a fully-connected neural network generator model, while the meshes depicted in Column 415 were generated using a GAN architecture.

In the illustrated embodiment, the meshes in a given row were generated using the same actuator configurations. That is, for a given row, the mesh depicted in the Column 405 was simulated by the Simulation Component 335 using a set of actuator values as input, the mesh depicted in the Column 410 was generated using a trained fully-connected neural network suing the same set of actuator values, and the mesh depicted in the Column 415 was generated with a trained GAN architecture using the same set of actuator values. FIG. 4 thus illustrates how the deep learning models can generate high-fidelity Predicted Meshes 365, which can be used to evaluate the animatronic design.

Figure 5:
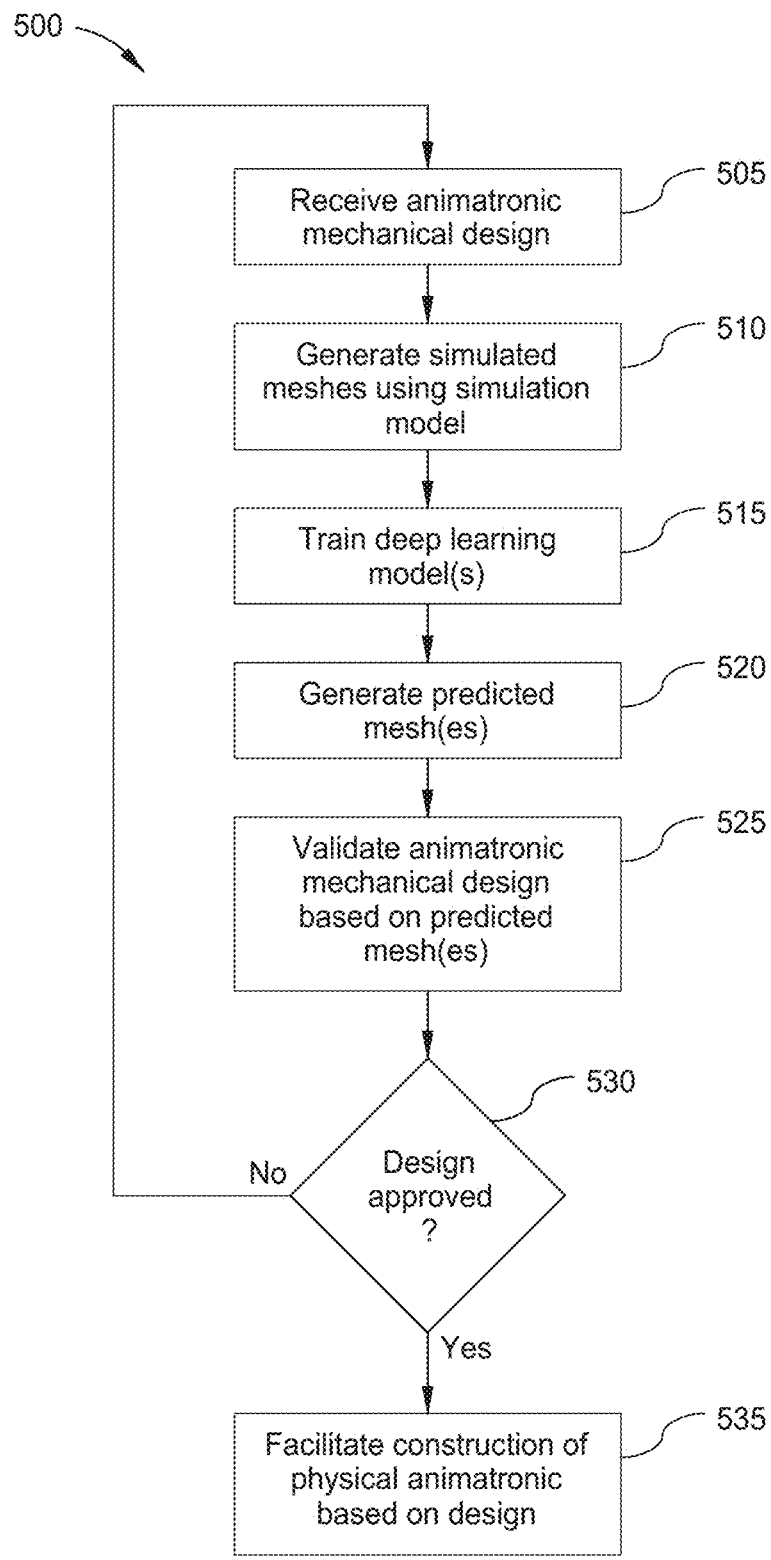
FIG. 5 is a flow diagram illustrating a method for using machine learning to facilitate development of animatronics, according to one embodiment disclosed herein.

FIG. 5 is a flow diagram illustrating a method 500 for using machine learning to facilitate development of animatronics, according to one embodiment disclosed herein. In the illustrated embodiment, the method 500 begins at block 505, where a Design Application 330 receives an animatronic mechanical design (e.g., from a user). As discussed above, in an embodiment, the animatronic mechanical design specifies the details necessary to simulate the design, such as the actuator types and placements, the skin material and actuation points, and the like. In some embodiments, the animatronic mechanical design further specifies the endpoints of each actuator. For example, if the actuator has its movement restricted (e.g., by other components of the design, or to ensure the movement is within the desired goals), the animatronic mechanical design specifies the extremes of the travel each actuator is allowed.

The method 500 then continues to block 510, where the Design Application 330 generates one or more simulated meshes for the animatronic mechanical design using a simulation model. In an embodiment, the simulation model is a physics model that takes into account the elasticity/density of the skin, the power and placement of the actuators, and the like, in order to determine the deformations that the artificial skin will form when a given set of actuator parameters are applied to the actual animatronic once constructed. The method 500 then continues to block 515, where the Design Application 330 uses these simulated meshes to train one or more deep learning models, as discussed above. At block 520, the Design Application 330 can use these trained models to generate one or more predicted meshes for the animatronic design, based on a set of actuator configurations.

In one embodiment, the set of configurations used to generate the predictive meshes are provided by a user. In some embodiments, the user can specify two or more poses (e.g., sets of configurations), and the Design Application 330 generates intermediate poses (sets of actuator configurations) between the specified poses, in order to predict the deformation of the skin as the actuators move between poses, in addition to while stopped at each pose. These predicted meshes can be used to validate the underlying design. The method 500 then continues to block 525.

At block 525, the Design Application 330 validates the animatronic mechanical design using the generated predictive meshes. In one embodiment, as discussed above, the Design Application 330 compares one or more of the predicted meshes against predefined criteria (e.g., vertex spacing criteria) to determine whether the predicted pose would cause artificial skin stretching or compression beyond a predefined threshold. These extreme deformations may cause undesirable texture or appearance of the artificial skin, which may cause the user to redesign the animatronic mechanical design. In some embodiments, validation includes outputting for display one or more of the predicted meshes, such that a user can view the expected deformations in order to determine whether the animatronic design is ready for production.

The method 500 then continues to block 530, where the Design Application 330 determines whether the animatronic mechanical design has been approved (e.g., by a user). If not, the method 500 returns to block 505 where the Design Application 330 awaits a revised design. If the animatronic design has been approved, however, the method 500 continues to block 535, where the Design Application 330 facilitates the construction of the physical animatronic device based on the design. In one embodiment, this includes transmitting some or all of the design to other entities and/or systems for review, approval, and/or construction of some or all of the design.

Figure 6:
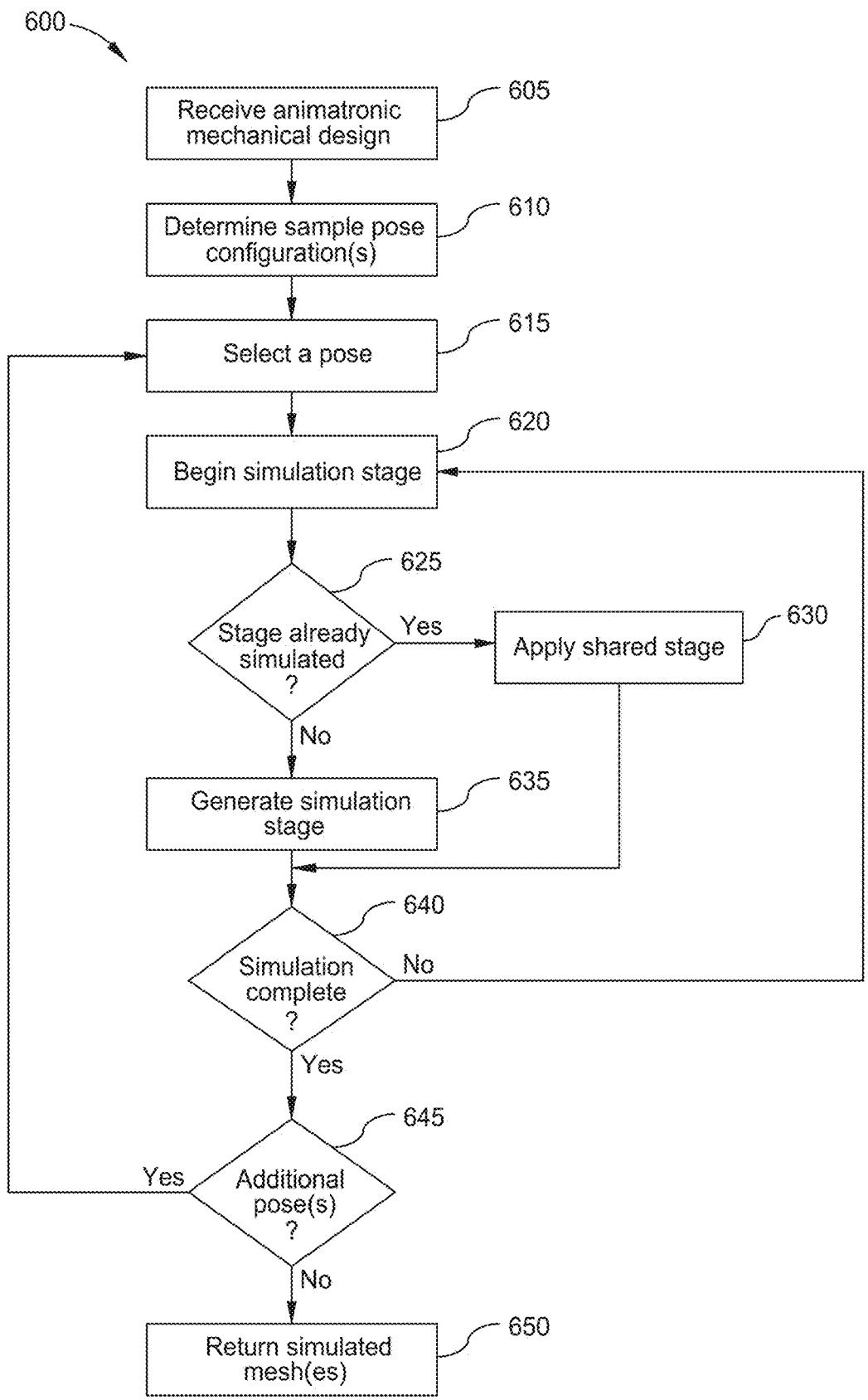
FIG. 6 is a flow diagram illustrating a method for generating simulated meshes to train machine learning models, according to one embodiment disclosed herein.

FIG. 6 is a flow diagram illustrating a method 600 for generating simulated meshes to train machine learning models, according to one embodiment disclosed herein. The method 600 provides additional detail for the simulation process described above, and begins at block 605, where the Design Application 330 receives an animatronic mechanical design, as discussed above. At block 610, the Design Application 330 determines one or more sample poses (e.g., actuator configurations) to be used to generate simulated meshes. In one embodiment, one or more sample poses are specified by the user. In some embodiments, one or more sample poses are generated by the Design Application 330.

In some embodiment, the Design Application 330 generates or receives actuator configurations representing the outermost deflections each actuator is capable of achieving. In one embodiment, the Design Application 330 then creates one or more intermediate poses between these extremes. That is, the Design Application 330 generates a set of random or pseudo-random values in the range between the allowable extremes, for each actuator. In some embodiments, the user can further specify one or more actuator configurations representing poses that are particularly extreme or difficult, to ensure the trained models can learn these difficult positions.

In one embodiment, the Design Application 330 uses adaptive learning to determine sample poses, in order to accelerate the process of training the neural network(s) to generate predicted deformations. Note that as the number of actuators in a design increases, the set of possible configurations grows exponentially. If improper poses are selected, the network may be "over-fit" during training, rendering it unsatisfactory for use. However, the computing resources required to generate a sufficient number of randomly-selected simulated meshes may be prohibitively expensive in some embodiments. Some embodiments of the present disclosure therefore provide data-driven active learning to select actuator-mesh pairs that make the training process converge faster and more robustly.

In some embodiments of the present disclosure, Learning Active Learning (LAL) is applied to simulate runs of an active learning method as a subroutine, in order to produce data that helps select incoming observations. This allows new training data to be generated on demand, adaptively, during the training of the model(s). In an embodiment, this simulation data is model state (plus actuator values) mapped to a reduction in generalization error, which is computed in the test set. In one embodiment, a regressor model is trained to learn batch selection rule(s) (e.g., to rank observations by decreasing reduction in generalization error). In some embodiments, the model state features (e.g., the mesh that the generator creates at any given point in training) is reduced to a scalar (delta in generalization error), allowing the LAL framework to be applied to generate the generation of unstructured meshes (as opposed to classification problems).

The LAL regressor can be a convolutional neural network that reduces the mesh to a delta in generalization error. In an embodiment, the LAL procedure is divided into a main routine, given by Algorithm 1 (GEN-LAL INDEPENDENT) below, and a subroutine, given by Algorithm 2 (SIMULATED RANDOM-AL) below. This enables enhanced selection of sample poses to reduce over-fitting and improve the performance of the generator neural network(s), particularly with respect to difficult or unusual poses.

---

Algorithm 1 (GEN-LAL INDEPENDENT)

---

Data: $\{\tau_0,...,\tau_N\}$(simulation configurations).
  g (mesh Generator). f (test error delta Regressor). B sample batch size.
  TR (current train set), P (observation pool), TT (test set).
Result: $\{x_1,...,x_B\}$ sample batch of proposed actuatorconfigurations.
$\mathcal{D} \leftarrow$ TR $\mathcal{D} \leftarrow$ TT;
SPLIT $\leftarrow$ random partitioning funciton;
$\phi \leftarrow \emptyset$; $\eta \leftarrow \emptyset$; $\delta \leftarrow \emptyset$;
for $\tau \leftarrow \{\tau_0,...,\tau_N\}$ do
  $(\phi_\tau, \eta_\tau, \delta_\tau) \leftarrow$ SIMULATED RANDOM - AL $(\mathcal{D}, \mathcal{D}, g, SPLIT, \tau)$;
  Append $(\phi_\tau, \eta_\tau, \delta_\tau)$ to $(\phi, \eta, \delta)$ respectively;
end
Train Regressor f on $(\phi, \eta) \rightarrow \delta$;
$X_B \leftarrow$ arg max$_s$ $\square_{P\ x\ \in\ s}$ f (x) ;
Return $X_B$

---

Algorithm 2 (SIMULATED RANDOM-AL)

---

Data: M (number of samples).SPLIT (defines init set and simulated pool).
  $\mathcal{D}$(train set). D' (test set). g (mesh Generator model).
Result: $(\phi, \eta)$ (model state and actuator features)and
  $\delta$ (reduction in generalization error).
$L_\tau, U_\tau \leftarrow$ SPLIT (D, $\tau$);
Train Generator $g_\tau$ instance on $L_\tau$;
$\ell_\tau \leftarrow \ell_0$ (test set loss estimate);
Compute $\phi_0$ (model - state parameters)and append to $\phi$;
Append $\eta_0$(actuators corresponding to $L_\tau$) to $\eta$;
$L_0 \leftarrow L_\tau$;
for t $\leftarrow$ 1 to M do
  Select $x_t \in U_\tau$ at random;
  $L_t \leftarrow L_{t-1} \cup \{x\}$;
  Append $x_t$ to $\eta$;
  Train Generator $g_\tau$ on $L_t$;
  Compute $\phi_t$ (model - state parameters)and append to $\phi$);
  Append $(\ell_\tau - \ell_t)$to $\delta$;
  $\ell_\tau \leftarrow \ell_t$ (test set loss estimate)
end
Return $(\phi, \eta, \delta)$

---

Returning to the method 600, at block 615, the Design Application 330 selects one of the determined poses to be simulated. At block 620, the Design Application 330 then begins the first simulation stage to generate a simulated mesh for the pose. The method 600 then continues to block 625, where the Design Application 330 determines whether the begun simulation stage has already been completed while generating a different simulated mesh, such that the output of that stage can be reused with the current stage. If so, the method 600 proceeds to block 630, where the Design Application 330 applies the results of the prior stage, to save processing time. The method 600 then proceeds to block 640, discussed in more detail below.

Returning to block 625, if the Design Application 330 determines that the current simulation stage is new (e.g., no prior work can be re-used), the method 600 proceeds to block 635, where the Design Application 330 completes the simulation stage as normal (e.g., simulating the deformation of the skin using physics models). The method 600 then continues to block 640, where the Design Application 330 determines whether simulation of the selected pose has completed (e.g., whether all required simulation stages have completed). If not, the method 600 returns to block 620 to begin the next simulation stage. If the simulated mesh has been fully generated, however, the method 600 continues to block 645, where the Design Application 330 determines whether there is at least one additional sample pose that needs to be simulated. If so, the method 600 returns to block 615. Otherwise, the method 600 terminates at block 650, where the Design Application 330 returns and/or stores the generated simulated meshes for future use.

Figure 7:
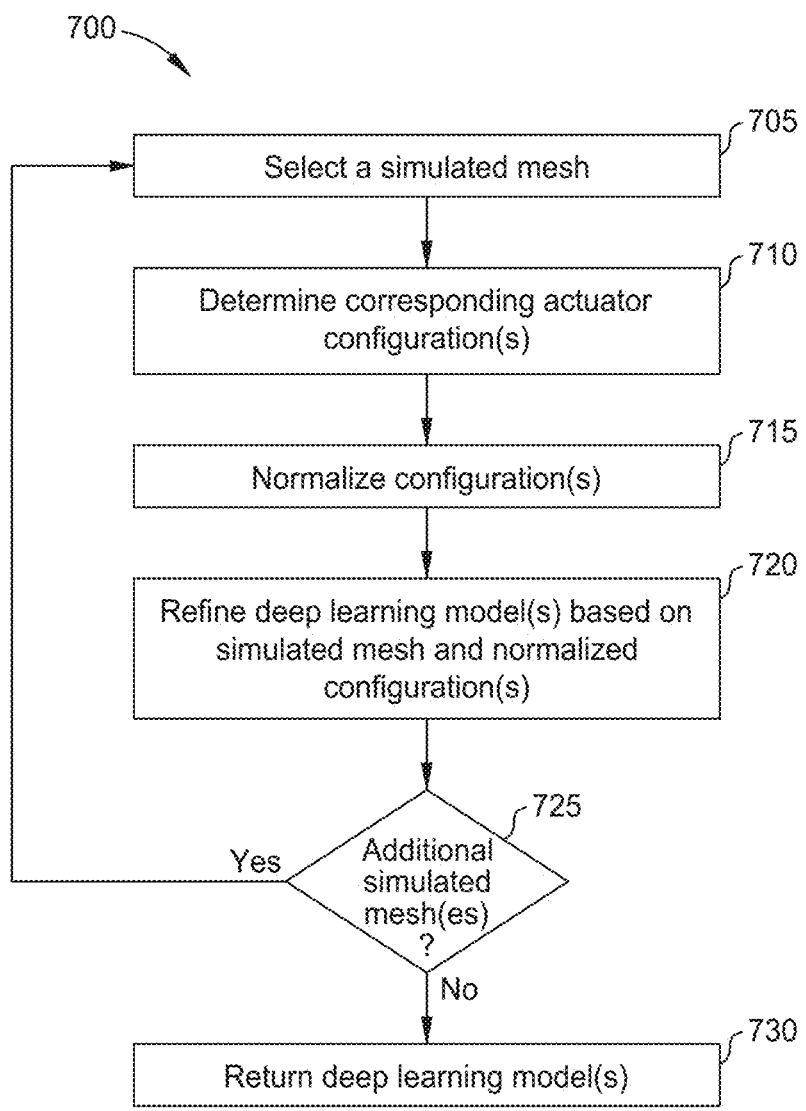
FIG. 7 is a flow diagram illustrating a method for training deep learning models to predict animatronic meshes, according to one embodiment disclosed herein.

FIG. 7 is a flow diagram illustrating a method 700 for training deep learning models to predict animatronic meshes, according to one embodiment disclosed herein. The method 700 begins at block 705, where the Design Application 330 selects one of the previously-simulated meshes to train the learning model. The method 700 then continues to block 710, where the Design Application 330 determines the corresponding actuator configuration(s) that were used to generate the simulated mesh. In one embodiment, each simulated mesh is associated with data (e.g., metadata) that stores the actuator parameters used to generate the mesh. At block 715, the Design Application 330 normalizes this configuration data.

In one embodiment, normalizing the data includes converting each of the actuator configuration values to a value between zero and one, based on the min-max range of the actuator. That is, based on the minimum and maximum rotation or translation values for the actuator, the Design Application 330 can scale the value specified in the actuator configuration to a value between zero and one. The method 700 then continues to block 720, where the Design Application 330 refines the learned model(s) based on the selected mesh and the retrieved and normalized actuator configuration(s). As discussed above, in one embodiment, this includes training three neural networks: one for each dimension in the mesh. In such an embodiment, the Design Application 330 will apply the value of the "x" coordinate of each respective vertex as the target output for a respective neuron in a first model, the "y" coordinate of each respective vertex as the target value of a respective neuron in a second model, and the "z" coordinate of each respective vertex in the mesh as the target output for a respective neuron in a third model.

To train the models, the normalized actuator configuration values are then provided to the models as input. In an embodiment, one or more weight(s) of the models are then modified or refined to minimize the vertex-to-vertex (or surface-to-surface) loss between the predictions generated by the model and the actual positions of the vertices, as indicated by the simulated mesh. The method 700 then proceeds to block 725, where the Design Application 330 determines whether there is at least one additional simulated mesh that needs to be ingested. If so, the method 700 returns to block 705. Otherwise, the method 700 terminates at block 730, where the Design Application 330 returns the trained models for use.

Figure 8:
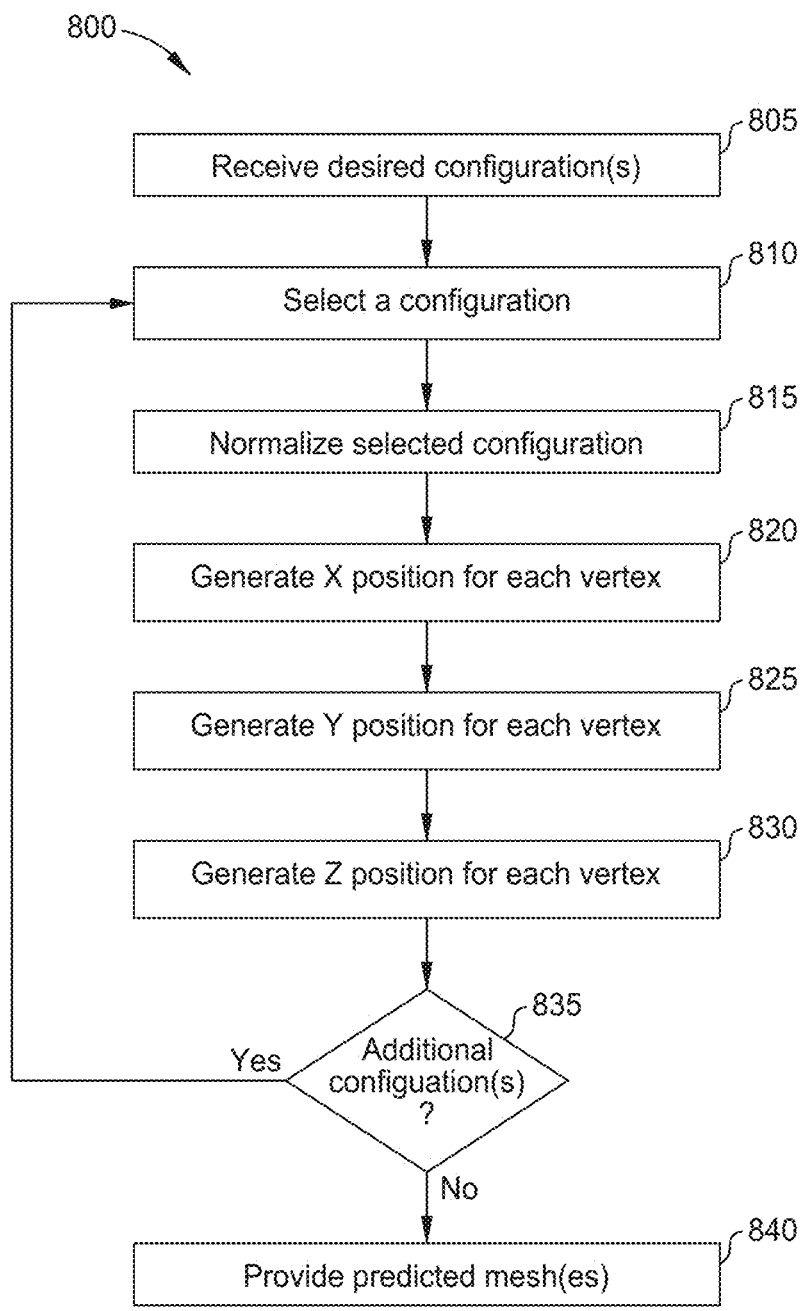
FIG. 8 is a flow diagram illustrating a method for generating predicted meshes for an animatronic design, according to one embodiment disclosed herein.

FIG. 8 is a flow diagram illustrating a method 800 for generating predicted meshes for an animatronic design, according to one embodiment disclosed herein. The method 800 begins at block 805, where a Design Application 330 receives a set of one or more desired configurations. In an embodiment, these actuator positions are specified by a user, in order to visualize the resulting deformations of an animatronic. In one embodiment, the user specifies these values by entering them manually (e.g., typing them in, dragging a sliding element on a GUI, and the like). In some embodiments, the user can specify two or more configurations, and the Design Application 330 can generate a series of values between them, in order to interpolate movement from a first pose to a second. The method 800 then proceeds to block 810.

At block 810, the Design Application 330 selects one of the provided configuration(s), and prepares to generate a predicted mesh. At block 815, the Design Application 330 normalizes the selected configuration, as discussed above. The method 800 then continues to block 820, where the Design Application 330 generates, for each vertex in the output mesh, a position along a first axis (e.g., the "x" axis). In one embodiment, the Design Application 330 does so by providing the actuator configuration to a first trained model that outputs the "x" value for each vertex, as discussed above. At block 825 and 830, the Design Application 330 similarly generates a value for each vertex's position along a second axis (e.g., the "y" axis) and each vertex's position along a third axis (e.g., the "z" axis), respectively. Using these coordinates, the Design Application 330 can then place each vertex in there-dimensional space, such that the predicted mesh can be output or rendered.

The method 800 then proceeds to block 835, where the Design Application 330 determines whether there is at least one additional configuration to be processed. If so, the method 800 returns to block 810. Otherwise, the method 800 proceeds to block 840, where the Design Application 330 provides the generated predictive mesh(es). In one embodiment, the Design Application 330 does so by rendering an image of each respective predicted mesh, and displaying the image(s) on a GUI. Generally, at block 840, the Design Application 330 displays the mesh(es) to a user. In some embodiments, the predicted meshes are generated and displayed in real-time as the user specifies actuator configurations. This enables improved creation of animatronic designs.

Figure 9:
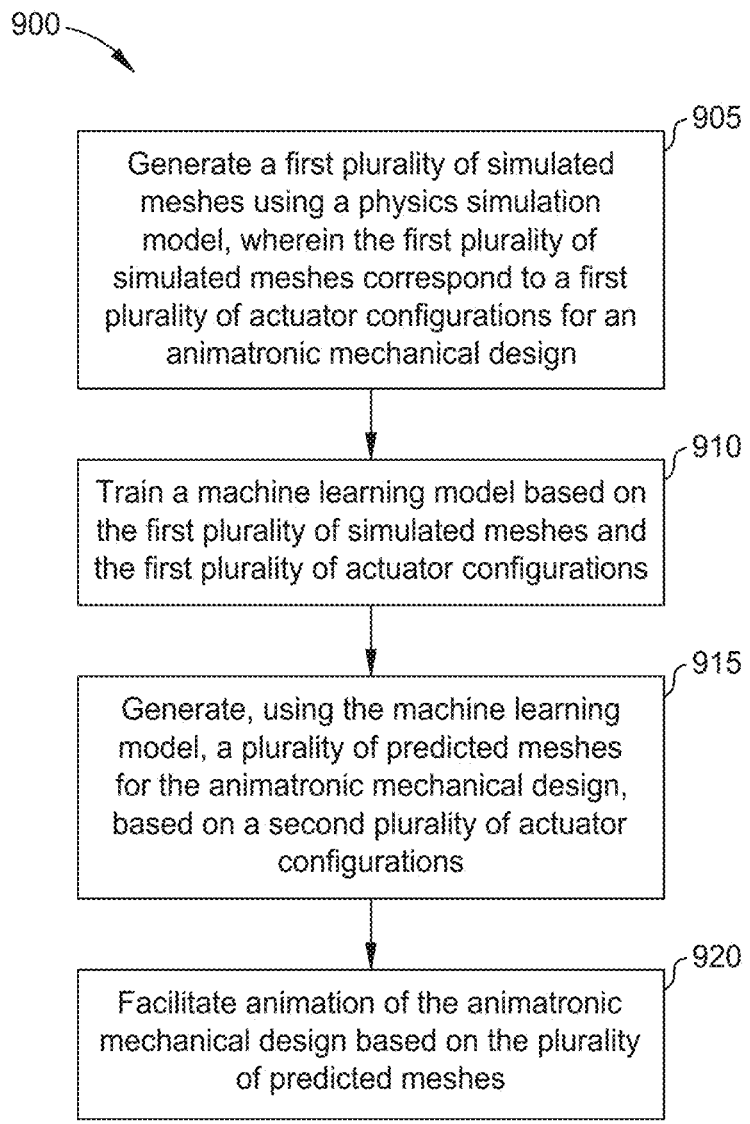
FIG. 9 is a flow diagram illustrating a method of using machine learning to aid animatronic design, according to one embodiment disclosed herein.

FIG. 9 is a flow diagram illustrating a method of 900 using machine learning to aid animatronic design, according to one embodiment disclosed herein. The method 900 begins at block 905, where a Design Application 330 generates a first plurality of simulated meshes using a physics simulation model, wherein the first plurality of simulated meshes correspond to a first plurality of actuator configurations for an animatronic mechanical design. At block 910, the Design Application 330 trains a neural network based on the first plurality of simulated meshes and the first plurality of actuator configurations. The method 900 then proceeds to block 915 where the Design Application 330 generates, using the neural network, a plurality of predicted meshes for the animatronic mechanical design, based on a second plurality of actuator configurations. Finally, at block 920, the Design Application 330 facilitates evaluation of the animatronic mechanical design based on the plurality of predicted meshes.

In the current disclosure, reference is made to various embodiments. However, it should be understood that the present disclosure is not limited to specific described embodiments. Instead, any combination of the following features and elements, whether related to different embodiments or not, is contemplated to implement and practice the teachings provided herein. Additionally, when elements of the embodiments are described in the form of "at least one of A and B," it will be understood that embodiments including element A exclusively, including element B exclusively, and including element A and B are each contemplated. Furthermore, although some embodiments may achieve advantages over other possible solutions or over the prior art, whether or not a particular advantage is achieved by a given embodiment is not limiting of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, embodiments described herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments described herein may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations or block diagrams of methods, apparatuses (systems), and computer program products according to embodiments of the present disclosure. It will be understood that each block of the flowchart illustrations or block diagrams, and combinations of blocks in the flowchart illustrations or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations or block diagrams.

The flowchart illustrations and block diagrams in the Figures illustrate the architecture, functionality, and operation of possible implementations of systems, methods, and computer program products according to various embodiments of the present disclosure. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order or out of order, depending upon the functionality involved. It will also be noted that each block of the block diagrams or flowchart illustrations, and combinations of blocks in the block diagrams or flowchart illustrations, can be implemented by special purpose hardware-based systems that perform the specified functions or acts, or combinations of special purpose hardware and computer instructions.

While the foregoing is directed to embodiments of the present disclosure, other and further embodiments of the disclosure may be devised without departing from the basic scope thereof, and the scope thereof is determined by the claims that follow.

What is claimed is:

1. A method comprising:
generating a first plurality of static simulated meshes using a physics simulation model, wherein each respective static simulated mesh of the first plurality of static simulated meshes corresponds to a respective actuator configuration of a first plurality of actuator configurations for an animatronic mechanical design, wherein the animatronic mechanical design comprises a plurality of actuators and a deformable physical material coupled to the plurality of actuators;
training a machine learning model based on the first plurality of static simulated meshes and the first plurality of actuator configurations, wherein at least one actuator configuration of the first plurality of actuator configurations comprises a plurality of values corresponding to an actuator of the plurality of actuators that has a plurality of degrees of freedom to drive the deformable physical material of the animatronic mechanical design, wherein at least one input neuron of the machine learning model corresponds to either (i) one or more respective actuators of the plurality of actuators, or (ii) an actuation point of the deformable physical material, wherein training the machine learning model comprises:
generating a first predicted mesh using a first actuator configuration of the first plurality of actuator configurations as input to the machine learning model, wherein:
the machine learning model uses a quasi-static framework to predict a state of the animatronic mechanical design when the first actuator configuration is applied to the plurality of actuators, and
the first predicted mesh corresponds to predicted deformation of the deformable physical material when the first actuator configuration is applied to the plurality of actuators; and
refining the machine learning model based on a difference between the first predicted mesh and a first simulated mesh, of the first plurality of simulated meshes, corresponding to the first actuator configuration;
generating, using the machine learning model, a single predicted mesh for the animatronic mechanical design by processing a single set of actuator configurations as input to the machine learning model; and
facilitating virtual animation of the animatronic mechanical design based on the single predicted mesh.

2. The method of claim 1, wherein the deformable physical material comprises a flexible artificial skin and a wherein the plurality of actuators are arranged to actuate the flexible artificial skin, wherein the machine learning model comprises a neural network, and wherein each respective output neuron in the neural network corresponds to a respective vertex in the single predicted mesh.

3. The method of claim 2, further comprising determining the first plurality of actuator configurations, comprising:
determining a set of actuator configurations representing extrema of each of the plurality of actuators; and
determining a set of actuator configurations representing intermediate positions between the extrema of each of the plurality of actuators.

4. The method of claim 2, wherein prior to training the neural network, the first plurality of actuator configurations are normalized such that each respective actuator configuration of the first plurality of actuator configurations comprises a respective set of values ranging from zero to one, and wherein the respective set of values indicate a position and an orientation of a respective actuator of the plurality of actuators.

5. The method of claim 1, wherein training the machine learning model further comprises providing the first plurality of actuator configurations as input and providing the first plurality of simulated meshes as target output to optimize surface-to-surface loss between the first plurality of simulated meshes and corresponding predicted meshes.

6. The method of claim 1, wherein the machine learning model comprises a generator network configured to generate predicted meshes and a discriminator network configured to identify differences between the predicted meshes and the first plurality of simulated meshes.

7. The method of claim 1, wherein training the machine learning model further comprises using active learning to train a first neural network by:
selecting one or more clusters of pose configurations using a convolutional neural network discriminator;
determining a second plurality of actuator configurations for the one or more clusters of pose configurations;
generating a second plurality of simulated meshes using the physics simulation model, based on the second plurality of actuator configurations; and
refining the first neural network using the second plurality of simulated meshes.

8. The method of claim 1, further comprising:
determining that the animatronic mechanical design is acceptable, based on determining that the single predicted mesh meets user expectations;
facilitating construction of the animatronic mechanical design; and
animating the constructed animatronic mechanical design, based on the virtual animation.

9. A non-transitory computer-readable medium containing computer program code that, when executed by operation of one or more computer processors, performs an operation comprising:
generating a first plurality of static simulated meshes using a physics simulation model, wherein each respective static simulated mesh of the first plurality of static simulated meshes corresponds to a respective actuator configuration of a first plurality of actuator configurations for an animatronic mechanical design, wherein the animatronic mechanical design comprises a plurality of actuators and a deformable physical material coupled to the plurality of actuators;
training a machine learning model based on the first plurality of static simulated meshes and the first plurality of actuator configurations, wherein at least one actuator configuration of the first plurality of actuator configurations comprises a plurality of values corresponding to an actuator of the plurality of actuators that has a plurality of degrees of freedom to drive the deformable physical material of the animatronic mechanical design, wherein at least one input neuron of the machine learning model corresponds to either (i) one or more respective actuators of the plurality of actuators, or (ii) an actuation point of the deformable physical material, wherein training the machine learning model comprises:
generating a first predicted mesh using a first actuator configuration of the first plurality of actuator configurations as input to the machine learning model, wherein:
the machine learning model uses a quasi-static framework to predict a state of the animatronic mechanical design when the first actuator configuration is applied to the plurality of actuators, and
the first predicted mesh corresponds to predicted deformation of the deformable physical material when the first actuator configuration is applied to the plurality of actuators; and
refining the machine learning model based on a difference between the first predicted mesh and a first simulated mesh, of the first plurality of simulated meshes, corresponding to the first actuator configuration;
generating, using the machine learning model, a single predicted mesh for the animatronic mechanical design by processing a single set of actuator configurations as input to the machine learning model; and
facilitating virtual animation of the animatronic mechanical design based on the single predicted mesh.

10. The non-transitory computer-readable medium of claim 9, wherein the deformable physical material comprises a flexible artificial skin wherein the plurality of actuators are arranged to actuate the flexible artificial skin, wherein the machine learning model comprises a neural network, and respective output neuron in the neural network corresponds to a respective vertex in the single predicted mesh.

11. The non-transitory computer-readable medium of claim 10, the operation further comprising determining the first plurality of actuator configurations, comprising:
determining a set of actuator configurations representing extrema of each of the plurality of actuators; and
determining a set of actuator configurations representing intermediate positions between the extrema of each of the plurality of actuators.

12. The non-transitory computer-readable medium of claim 10, wherein prior to training the neural network, the first plurality of actuator configurations are normalized such that each respective actuator configuration of the first plurality of actuator configurations comprises a respective set of values ranging from zero to one, and wherein the respective set of values indicate a position and an orientation of a respective actuator of the plurality of actuators.

13. The non-transitory computer-readable medium of claim 9, wherein training the machine learning model further comprises providing the first plurality of actuator configurations as input and providing the first plurality of simulated meshes as target output to optimize surface-to-surface loss between the first plurality of simulated meshes and corresponding predicted meshes.

14. The non-transitory computer-readable medium of claim 9, wherein training the machine learning model comprises using active learning to train a first neural network by:
selecting one or more clusters of pose configurations using a convolutional neural network discriminator;
determining a second plurality of actuator configurations for the one or more clusters of pose configurations;
generating a second plurality of simulated meshes using the physics simulation model, based on the second plurality of actuator configurations; and
refining the first neural network using the second plurality of simulated meshes.

15. A system comprising:
one or more computer processors; and
a memory containing a program which when executed by the one or more computer processors performs an operation, the operation comprising:
generating a first plurality of static simulated meshes using a physics simulation model, wherein each respective static simulated mesh of the first plurality of static simulated meshes corresponds to a respective actuator configuration of a first plurality of actuator configurations for an animatronic mechanical design, wherein the animatronic mechanical design comprises a plurality of actuators and a deformable physical material coupled to the plurality of actuators;

training a machine learning model based on the first plurality of static simulated meshes and the first plurality of actuator configurations, wherein at least one actuator configuration of the first plurality of actuator configurations comprises a plurality of values corresponding to an actuator of the plurality of actuators that has a plurality of degrees of freedom to drive the deformable physical material of the animatronic mechanical design, wherein at least one input neuron of the machine learning model corresponds to either (i) one or more respective actuators of the plurality of actuators, or (ii) an actuation point of the deformable physical material, wherein training the machine learning model comprises-comprising:

generating a first predicted mesh using a first actuator configuration of the first plurality of actuator configurations as input to the machine learning model, wherein:

the machine learning model uses a quasi-static framework to predict a state of the animatronic mechanical design when the first actuator configuration is applied to the plurality of actuators, and the first predicted mesh corresponds to predicted deformation of the deformable physical material when the first actuator configuration is applied to the plurality of actuators; and refining the machine learning model based on a difference between the first predicted mesh and a first simulated mesh, of the first plurality of simulated meshes, corresponding to the first actuator configuration;

generating, using the machine learning model, a single predicted mesh for the animatronic mechanical design by processing a single set of actuator configurations as input to the machine learning model; and facilitating virtual animation of the animatronic mechanical design based on the single predicted mesh.

16. The system of claim 15, wherein the deformable physical material comprises a flexible artificial skin and the plurality of actuators are arranged to actuate the flexible artificial skin, wherein the machine learning model comprises a neural network, and respective output neuron in the neural network corresponds to a respective vertex in the single predicted mesh.

17. The system of claim 16, the operation further comprising determining the first plurality of actuator configurations, comprising:

determining a set of actuator configurations representing extrema of each of the plurality of actuators; and determining a set of actuator configurations representing intermediate positions between the extrema of each of the plurality of actuators.

18. The system of claim 16, wherein prior to training the neural network, the first plurality of actuator configurations are normalized such that each respective actuator configuration of the first plurality of actuator configurations comprises a respective set of values ranging from zero to one, and wherein the respective set of values indicate a position and an orientation of a respective actuator of the plurality of actuators.

19. The system of claim 15, wherein the machine learning model comprises a generator network configured to generate the plurality of predicted meshes and a discriminator network configured to identify differences between the plurality of predicted meshes and corresponding predicted meshes.

20. The system of claim 15, wherein training the machine learning model comprises using active learning to train a first neural network by:

selecting one or more clusters of pose configurations using a convolutional neural network discriminator;

determining a second plurality of actuator configurations for the one or more clusters of pose configurations;

generating a second plurality of simulated meshes using the physics simulation model, based on the second plurality of actuator configurations; and refining the first neural network using the second plurality of simulated meshes.

* * * * *

UNITED STATES PATENT AND TRADEMARK OFFICE
CERTIFICATE OF CORRECTION

PATENT NO. : 12,236,168 B2  
APPLICATION NO. : 16/601919  
DATED : February 25, 2025  
INVENTOR(S) : Kenneth J. Mitchell et al.

Page 1 of 1

It is certified that error appears in the above-identified patent and that said Letters Patent is hereby corrected as shown below:

In the Specification  
In Column 13, Line 37, delete "actuatorconfigurations." and insert -- actuator configurations. --.  
In Column 13, Line 38, delete "𝒟" and insert -- D' --.  
In Column 13, Line 39, delete "funciton;" and insert -- function; --.  
In Column 13, Line 42, delete "𝒟" and insert -- D' --.  
In Column 13, Line 52, delete "init" and insert -- unit --.

In the Claims  
In Column 18, Line 47, in Claim 2, delete "and a" and insert -- and --.  
In Column 21, Line 21, in Claim 15, delete "comprises-comprising:" and insert -- comprises: --.

Signed and Sealed this  
Twenty-ninth Day of April, 2025

Coke Morgan Stewart  
*Acting Director of the United States Patent and Trademark Office*